US012621003B2

(12) United States Patent
Chen et al.

(10) Patent No.: US 12,621,003 B2
(45) Date of Patent: May 5, 2026

(54) DECODING METHOD FOR REDUCING INFLUENCE OF NOISE OF POWER SIGNAL LINE AND DECODING CIRCUIT

(71) Applicant: NUVOTON TECHNOLOGY CORPORATION, Hsinchu City (TW)

(72) Inventors: Chih-Ming Chen, Zhubei City (TW); Cheng-Chung Chou, Zhubei City (TW)

(73) Assignee: NUVOTON TECHNOLOGY CORPORATION, Hsinchu City (TW)

( * ) Notice: Subject to any disclaimer, the term of this patent is extended or adjusted under 35 U.S.C. 154(b) by 110 days.

(21) Appl. No.: 18/890,849

(22) Filed: Sep. 20, 2024

(65) Prior Publication Data

US 2025/0323665 A1      Oct. 16, 2025

(30) Foreign Application Priority Data

Apr. 10, 2024      (TW) ................................. 113113422

(51) Int. Cl.
*H03M 7/30*        (2006.01)
*H03H 11/04*      (2006.01)
*H03M 13/11*      (2006.01)

(52) U.S. Cl.
CPC .............. *H03M 7/60* (2013.01); *H03H 11/04* (2013.01); *H03M 13/1105* (2013.01)

(58) Field of Classification Search
CPC ...... H03M 7/60; H03M 13/1105; H03H 11/04
USPC .......................................... 341/50, 155, 159
See application file for complete search history.

(56) References Cited

U.S. PATENT DOCUMENTS 7,656,339 B2 *   2/2010   Chmelar ............... H03M 1/002
                                                                         341/155
8,462,037 B2 *   6/2013   Singer ................... H03M 1/182
                                                                         341/155

* cited by examiner

*Primary Examiner* — Khai M Nguyen
(74) *Attorney, Agent, or Firm* — MUNCY, GEISSLER, OLDS & LOWE, P.C.

(57)                    ABSTRACT

The preferred embodiment of the present disclosure relates to a decoding method for reducing the influence of noise power signal line and a decoding circuit. The method includes: dividing an analog signal to be decoded into a plurality of levels; performing an edge detection according to the levels to obtain a first edge detection signal; setting the levels which is smaller than a lower level to the lower level and performing the edge detection to obtain the second edge detection signal; setting the levels which is greater than a higher level to the higher level and performing the edge detection to obtain a third edge detection signal; decoding the first, the second, the third edge detection signal to obtain an optimum edge detection signal.

10 Claims, 11 Drawing Sheets

Comparator_Slice OUT[2]

Comparator_Slice OUT[1]

Comparator_Slice OUT[0]

Edge_Detected

Bit_OUT

DECODING METHOD FOR REDUCING INFLUENCE OF NOISE OF POWER SIGNAL LINE AND DECODING CIRCUIT

CROSS-REFERENCE TO RELATED APPLICATION

This application claims the priority from the TW Patent Application No. 113113422, filed on Apr. 10, 2024, and all contents of such TW Patent Application are comprised in the present disclosure.

BACKGROUND

1. Field of the Invention

The present disclosure is related to noise reduction technologies, and in particular to a decoding method for reducing the influence of noise power signal line and a decoding circuit.

2. Description of the Related Art

Automatic charging is a popular device at the moment. The Universal Serial Bus Power Delivery (USB PD) protocol is currently the most widely used delivery specification. In addition to the main delivery interface charging and discharging through the VBUS pin, another related interface signal is on the CC pin. During data delivery (bit rate approximately 300K/s), the voltage level of the Channel Configuration pin (CC pin) is around 1.1V. Thus, any noise interference during the delivery process may affect the effectiveness of data reception during the message delivery process in the USB PD.

The USB PD protocol not only includes power, but also handles the coordination of data flow direction, data formats, and master-slave relations between two devices. The USB PD protocol is transmitted through the CC pin, and when it is converted to a digital signal, its data packet also includes the calculation and comparison of cyclic redundancy checks (CRC) to prevent erroneous packet data caused by noise interference from being used.

Thus, the known noise certification process also includes the following three different noise certification conditions:

|  | TX_NORMAL | TX_GROUP_1 | TX_GROUP_2 | TX_GROUP_3 |
|---|---|---|---|---|
| High_Level (norm) | 1100 mV | 1200 mV | 790 mV | 1290 mV |
| Low_Level (norm) | 25 mV | 0 mV | −25 mV | 250 mV |
| Bit Rate | 300 Kb/s | 270 Kb/s | 330 Kb/s | 330 Kb/s |
| Rise/Fall Time | 735 ns | 735 ns | 735 ns | 735 ns |

Testing Noise Conditions

It can be observed from the above three different noise certification conditions that the DC voltage level will drift upward or downward depending on different testing conditions.

SUMMARY

The present disclosure provides a method for reducing the influence of power signal line noise on decoding, a decoding circuit using the same, and a power supply/reception device using the same for adjusting the edge detection strategy prior to demodulation in a scenario where the signal is known, thereby overcoming the aforementioned noise conditions before subsequent carriers are demodulated into digital signals, ensuring correct decoding of the digital signal.

Embodiments of the present disclosure provide a decoding method for reducing influence of noise of power signal line. The decoding method for reducing influence of noise of power signal line includes: comparing a voltage level of an analog signal to be decoded with multiple reference voltages to generate a current level number; performing an edge detection process using the current level number at each time to obtain a first edge detection signal; after setting the current level number at each time that is less than a low-level number to the low-level number, performing the edge detection process to obtain a second edge detection signal; after setting the current level number at each time that is greater than a high-level number to the high-level number, performing the edge detection process to obtain a third edge detection signal; decoding the first edge detection signal, the second edge detection signal, and the third edge detection signal to obtain a first bit restored signal, a second bit restored signal, and a third bit restored signal, respectively, and comparing the first edge detection signal, the second edge detection signal, and the third edge detection signal with a bit time length to obtain an optimum bit restored signal, which has a smallest difference, among the first edge detection signal, the second edge detection signal, and the third edge detection signal; using the optimum bit restored signal to select an optimum edge detection signal from the first edge detection signal, the second edge detection signal, and the third edge detection signal as a specific edge detection signal for subsequent decoding, wherein the analog signal to be decoded is obtained from delivery of a known signal.

Embodiments of the present disclosure provide a decoding circuit. The decoding circuit includes: a plurality of comparators, a noise filtering and signal edge detection circuit, and a digital signal information processing circuit. Each of the plurality of comparators includes a first terminal, a second terminal, and an output terminal, wherein the first terminals of the plurality of comparators receive an analog signal to be decoded, wherein the second terminals of the plurality of comparators are respectively coupled to a plurality of reference voltage levels, wherein the plurality of reference voltage levels are different from each other. The noise filtering and signal edge detection circuit is coupled to the output terminals of the plurality of comparators, and outputs an optimum edge detection signal. The digital signal information processing circuit is coupled to the output terminals of the noise filtering and signal edge detection circuit, and generates a decoding signal according to the optimum edge detection signal.

The noise filtering and signal edge detection circuit determines a current level of the analog signal to be decoded based on signals output from the output terminals of the comparators, to obtain a current level number. The noise filtering and signal edge detection circuit performs an edge detection process based on the current level number at each time to obtain a first edge detection signal; After setting the current level number at each time that is less than a low-level number to the low-level number, the noise filtering and signal edge detection circuit performs the edge detection process to obtain a second edge detection signal. After setting the current level number at each time that is greater than a high-level number to the high-level number, the noise filtering and signal edge detection circuit performs the edge detection process to obtain a third edge detection signal. The digital signal information processing circuit coupled to the output terminals of the noise filtering and signal edge detection circuit is configured to decode the first edge detection signal, the second edge detection signal, and the third edge detection signal to obtain a first bit restored signal, a second bit restored signal, and a third bit restored signal, respectively, and is configured to compare the first edge detection signal, the second edge detection signal, and the third edge detection signal with a bit time length to obtain an optimum bit restored signal with a smallest difference. The digital signal information processing circuit selects, based on the optimum bit restored signal, a corresponding optimum edge detection signal from the first edge detection signal, the second edge detection signal, and the third edge detection signal as a specific edge detection signal for subsequent decoding, wherein the analog signal to be decoded is obtained from delivery of a known signal.

According to the preferred embodiments of the decoding method for reducing influence of noise of power signal line and the decoding circuit, the analog signal to be decoded is obtained via a channel configuration pin (CC pin) of a universal serial bus (USB) port. According to the preferred embodiment, the analog signal to be decoded is modulated according to a Bi-Phase Marker Code (BMC).

To further understand the technology, means, and effects of the present disclosure, reference may be made by the detailed description and drawing as follows. In this way, the purposes, features and concepts of the present disclosure can be thoroughly and concretely understood. However, the following detail description and drawings are only used to reference and illustrate the implementation of the present disclosure, and they are not used to limit the present disclosure.

BRIEF DESCRIPTION OF THE DRAWINGS

The drawings are provided to make the persons with ordinary knowledge in the field of the art further understand the present disclosure, and are incorporated into and constitute a part of the specification of the present disclosure. The drawings illustrate demonstrated embodiments of the present disclosure, and are used to explain the principal of the present disclosure together with the description of the present disclosure.

Figure 1:
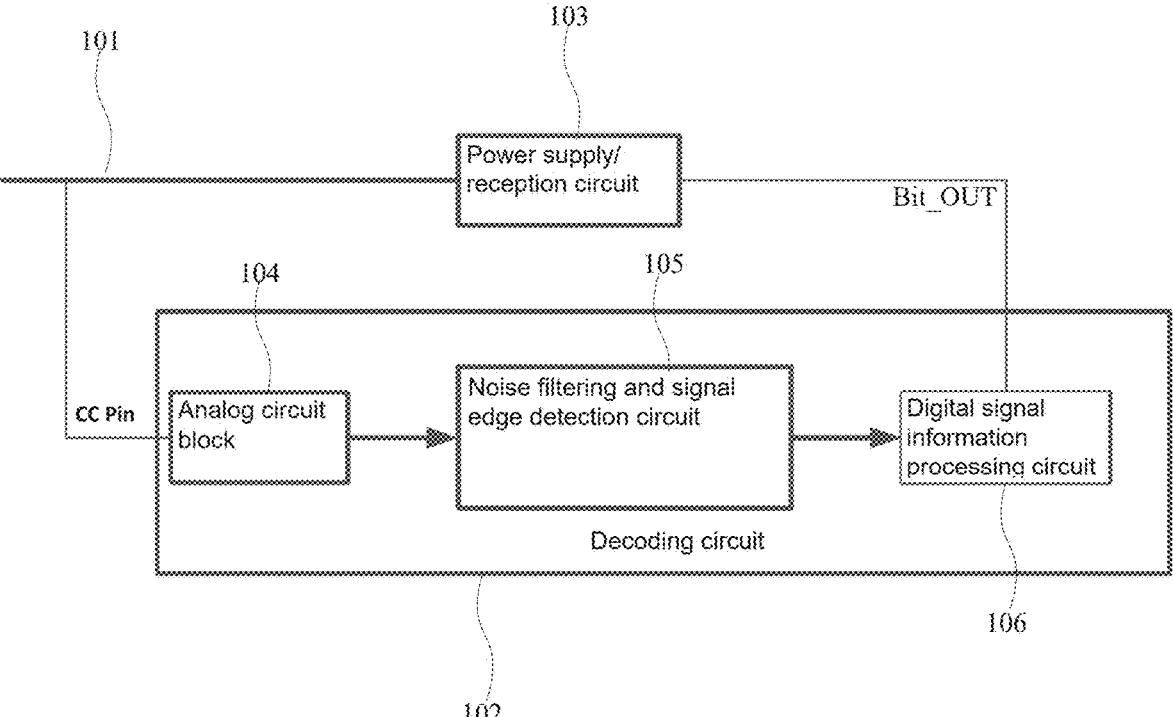
FIG. 1 is a schematic block diagram of a power supply/reception device according to a preferred embodiment of the present disclosure.

The embodiments of the present disclosure are described in detail as reference, and the drawings of the present disclosure are illustrated. In the case of possibility, the element symbols are used in the drawings to refer to the same or similar components. In addition, the embodiment is only one approach of the implementation of the design concept of the present disclosure, and the following multiple embodiments are not intended to limit the present disclosure.

DESCRIPTION OF THE PREFERRED EMBODIMENTS

FIG. 1 is a schematic block diagram of a power supply/reception device according to a preferred embodiment of the present disclosure. Please refer to FIG. 1. In this embodiment, a power supply/reception device using the USB PD protocol is exemplified. This power supply/reception device includes a USB 101, a decoding circuit 102, and a power supply/reception circuit 103. The USB 101 includes a channel configuration pin (CCpin). The decoding circuit 102 includes an analog circuit block 104, a noise filtering and signal edge detection circuit 105, and a digital signal information processing circuit 106. The power supply/reception circuit 103 is coupled to the USB port 101 and the decoding circuit 102. The power supply/reception circuit 103 receives an edge detection signal Bit_OUT (packet data bit output) provided by the decoding circuit 102, thereby facilitating communication of power capabilities and requirements with a device coupled to the other terminal of the USB port 101. In the USB PD system, data reception includes not only inputting the voltage signal from the CC pin but also converting it into actual digital message data with eliminated noise through digital sampling processing, facilitating the content decoding of data packets.

Figure 2:
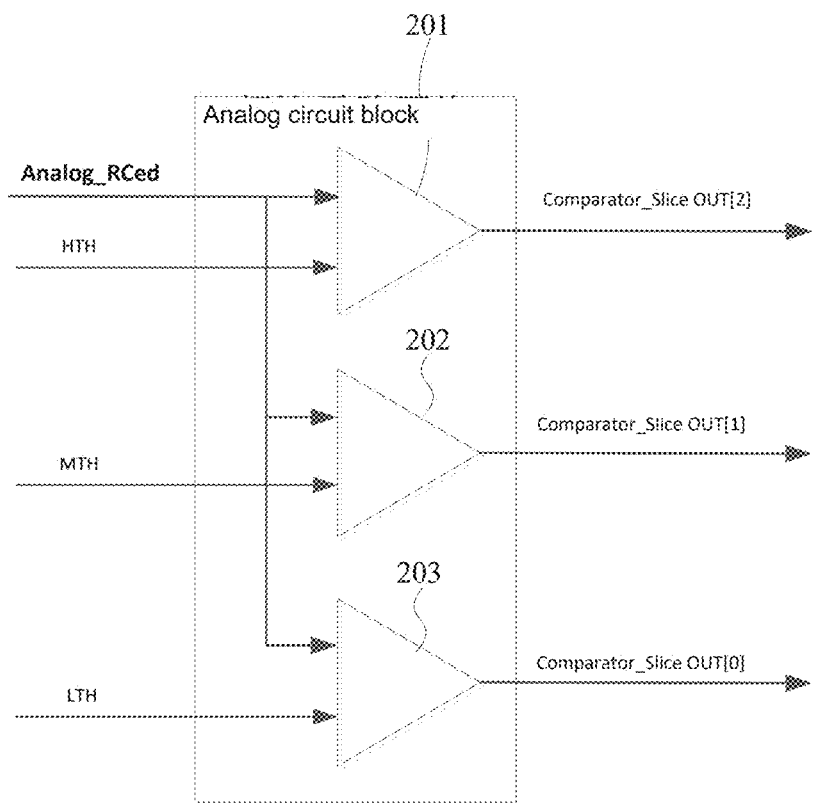
FIG. 2 is a schematic circuit diagram of an analog circuit block 104 according to a preferred embodiment of the present disclosure.

FIG. 2 is a schematic circuit diagram of an analog circuit block 104 according to a preferred embodiment of the present disclosure. Please refer to FIG. 2. In this embodiment, the analog circuit block 104 includes a first comparator 201, a second comparator 202, and a third comparator

203. Each of the comparators 201, 202, 203 includes a first terminal, a second terminal end, and an output terminal. The first terminal of each comparator 201, 202, 203 receives an analog signal Analog_RCed to be decoded obtained from the channel configuration pin CCpin. The second terminal of each comparator 201, 202, 203 is respectively coupled to a corresponding reference voltage level HTH (High Threshold), MTH (Middle Threshold), and LTH (Low Threshold). The comparator signals output by the output terminals of the comparators 201, 202, and 203 are respectively labeled as Comparator_Slice OUT[2], Comparator_Slice OUT[1], and Comparator_Slice OUT[0].

The noise filtering and signal edge detection circuit 105 is coupled to the output terminals of comparators 201, 202, and 203. Three variables are set in the noise filtering and signal edge detection circuit 105, namely a highest level variable Hi_count, a lowest level variable Low_count, and a current level number in_level.

Figure 3:
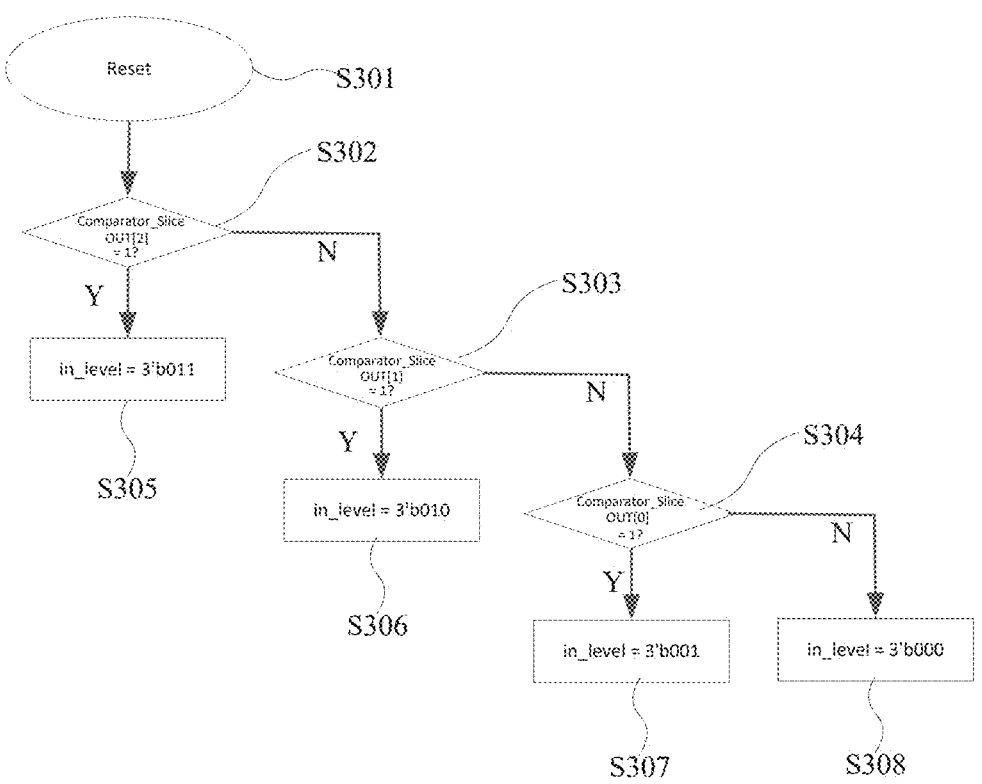
FIG. 3 is a schematic operation flowchart diagram of a current level number in_level performed by a noise filtering and signal edge detection circuit 105 according to a preferred embodiment of the present disclosure.

FIG. 3 is a schematic operation flowchart diagram of a current level number in_level performed by a noise filtering and signal edge detection circuit 105 according to a preferred embodiment of the present disclosure. Please refer to FIG. 3. In this embodiment, the operation of the current level number in_level performed by the noise filtering and signal edge detection circuit 105 includes the following steps:

Step S301: Initial reset.

Step S302: Determine whether the signal Comparator_Slice OUT[2] at the output terminal of comparator 201 is a logic high voltage. If yes, proceed to step S305. If no, proceed to step S303.

Step S303: Determine whether the signal Comparator_Slice OUT[1] at the output terminal of comparator 202 is a logic high voltage. If yes, proceed to step S306. If no, proceed to step S304.

Step S304: Determine whether the signal Comparator_Slice OUT[0] at the output terminal of comparator 203 is a logic high voltage. If yes, proceed to step S307. If no, proceed to step S308.

Step S305: Set the current level number in_level to the three-bit number 011.

Step S306: Set the current level number in_level to the three-bit number 010.

Step S307: Set the current level number in_level to the three-bit number 001.

Step S308: Set the current level number in_level to the three-bit number 000.

The execution time (sampling time) of the above process steps can be designed according to different needs and will not be elaborated here.

Figure 4:
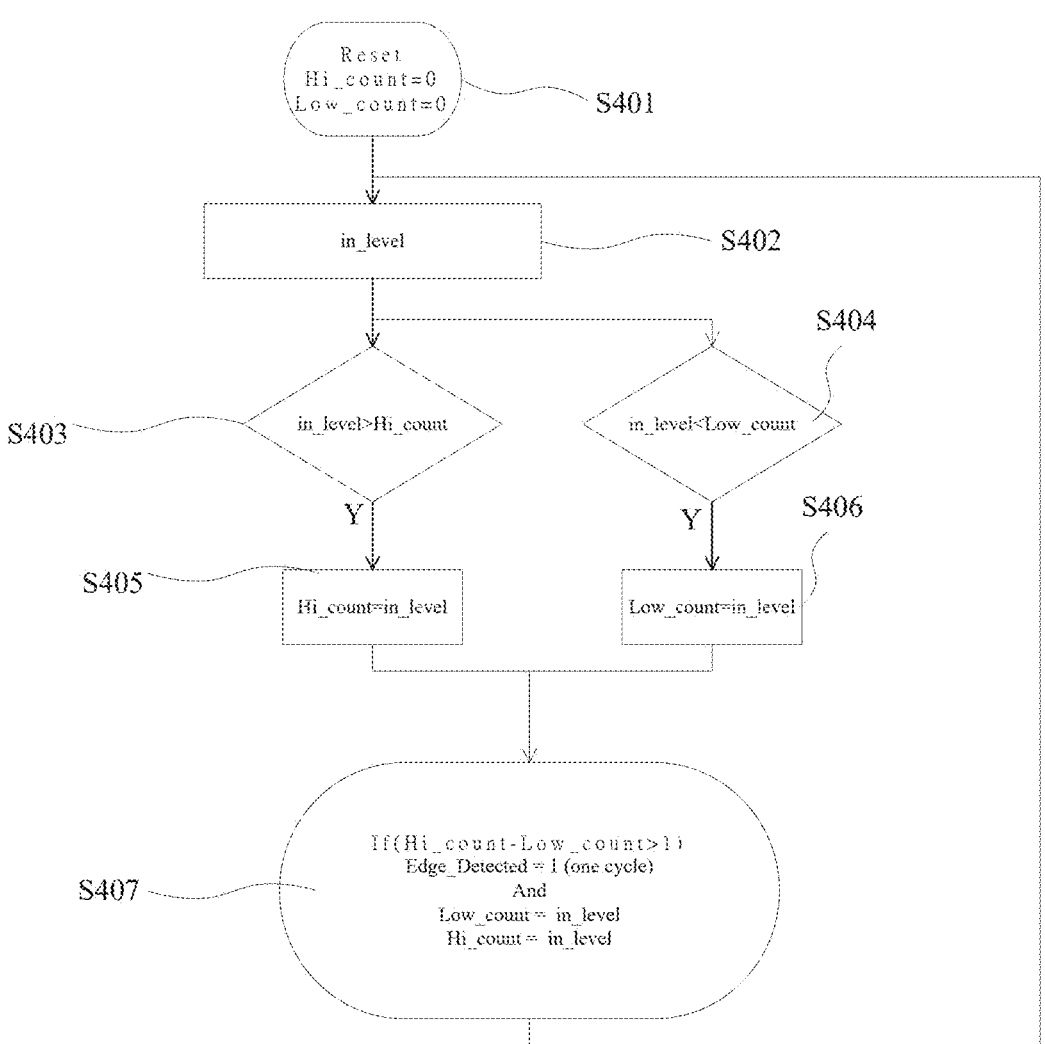
FIG. 4 is a schematic operation flowchart diagram of a highest level variable Hi_count, a lowest level variable Low_count performed by a noise filtering and signal edge detection circuit 105 according to a preferred embodiment of the present disclosure.

FIG. 4 is a schematic operation flowchart diagram of a highest level variable Hi_count, a lowest level variable Low_count performed by a noise filtering and signal edge detection circuit 105 according to a preferred embodiment of the present disclosure. Please refer to FIG. 4. The operation of the highest level variable Hi_count and the lowest level variable Low_count performed by the noise filtering and signal edge detection circuit 105 includes the following steps:

Step S401: Initial reset. Set the highest level variable Hi_count and the lowest level variable Low_count to 0.

Step S402: Input the current level number in_level.

Step S403: Determine whether the current level number in_level is greater than the highest level variable Hi_count. If yes, proceed to step S405.

Step S404: Determine whether the current level number in_level is less than the lowest level variable Low_count. If yes, proceed to step S406.

Step S405: Set the highest level variable Hi_count to the current level number in_level. Then, proceed to step S407.

Step S406: Set the lowest level variable Low_count to the current level number in_level. Then, proceed to step S407.

Step S407: Determine whether the difference between the highest level variable Hi_count and the lowest level variable Low_count is greater than a noise tolerance value. In this embodiment, the noise tolerance value is set to 1. When the difference between the highest level variable Hi_count and the lowest level variable Low_count is greater than the noise tolerance value, the noise filtering and signal edge detection circuit 105 outputs an edge detection pulse, and the highest level variable Hi_count and the lowest level variable Low_ count are set to the current level number in_level.

Figure 5:
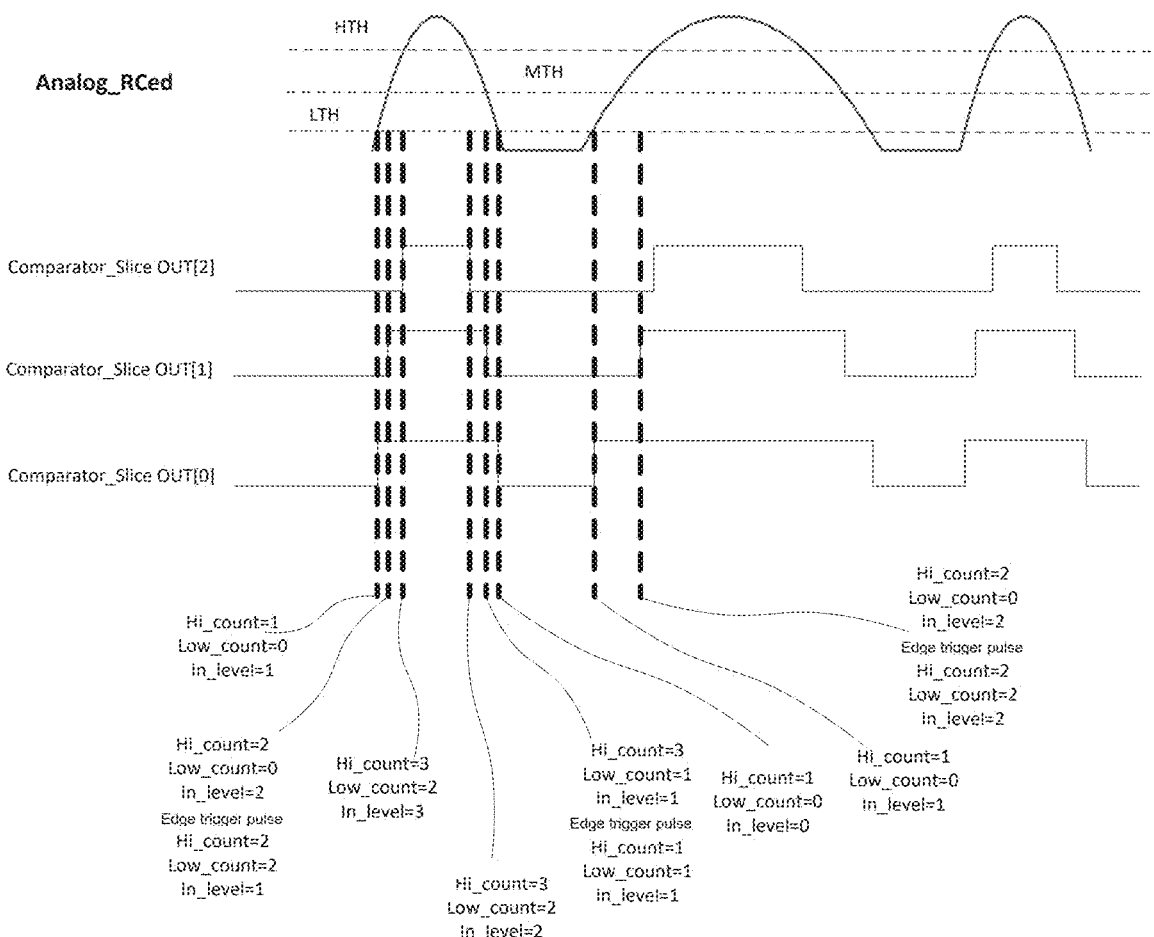
FIG. 5 is a schematic operation waveform diagram of a noise filtering and signal edge detection circuit 105 according to a preferred embodiment of the present disclosure.

FIG. 5 is a schematic operation waveform diagram of a noise filtering and signal edge detection circuit 105 according to a preferred embodiment of the present disclosure. Please refer to FIG. 5. To allow those skilled in the art to understand the aforementioned embodiments of FIG. 3 and FIG. 4, a graph with variable visualization is used, and the current changes in the variables are marked on the graph. Initially, when the signal Comparator_Slice OUT[0] at the output terminal of comparator 203 changes from logic low voltage to logic high voltage, the highest-level variable Hi_count changes to 1, the lowest-level variable Low_count remains at 0, and the current-level variable in_level changes from 0 to 1 according to the process in FIG. 4. Next, when the signal Comparator_Slice OUT[1] at the output terminal of comparator 202 changes from logic low voltage to logic high voltage, the highest-level variable Hi_count changes to 2, the lowest-level variable Low_count remains at 0, and the current-level variable in_level changes from 1 to 2 according to the process in FIG. 4. Since step S407 is triggered at this time, the noise filtering and signal edge detection circuit 105 outputs an edge detection pulse, Hi_count changes to 2, Low_count also changes to 2, and in_level changes to 2.

Next, when the signal Comparator_Slice OUT[2] at the output terminal of comparator 203 changes from logic low voltage to logic high voltage, Hi_count changes to 3, Low_ count remains at 2, and in_level changes from 2 to 3 according to the process in FIG. 4. Then, when the signal Comparator_Slice OUT[2] at the output terminal of comparator 203 changes from logic high voltage to logic low voltage, Hi_count remains at 3, Low_count remains at 2, and in_level changes from 3 to 2 according to the process in FIG. 4. When the signal Comparator_Slice OUT[1] at the output terminal of comparator 202 changes from logic high voltage to logic low voltage, Hi_count remains at 3, Low_count changes to 1, and in_level changes from 2 to 1 according to the process in FIG. 4. Similarly, since step S407 is triggered at this time, the noise filtering and signal edge detection circuit 105 outputs the edge detection pulse, Hi_count changes to 1, Low_count also changes to 1, and in_level changes to 1.

Next, when the signal Comparator_Slice OUT[0] at the output terminal of comparator 201 changes from logic high voltage to logic low voltage, Hi_count remains at 1, Low_ count changes to 0, and in_level changes from 1 to 0 according to the process in FIG. 4. Then, when the signal Comparator_Slice OUT[0] at the output terminal of comparator 201 changes from logic low voltage to logic high voltage, Hi_count remains at 1, Low_count remains at 0, and in_level changes from 0 to 1 according to the process in FIG.

4. The following embodiments can be inferred from the aforementioned rules and will not be repeated here.

Figure 6:
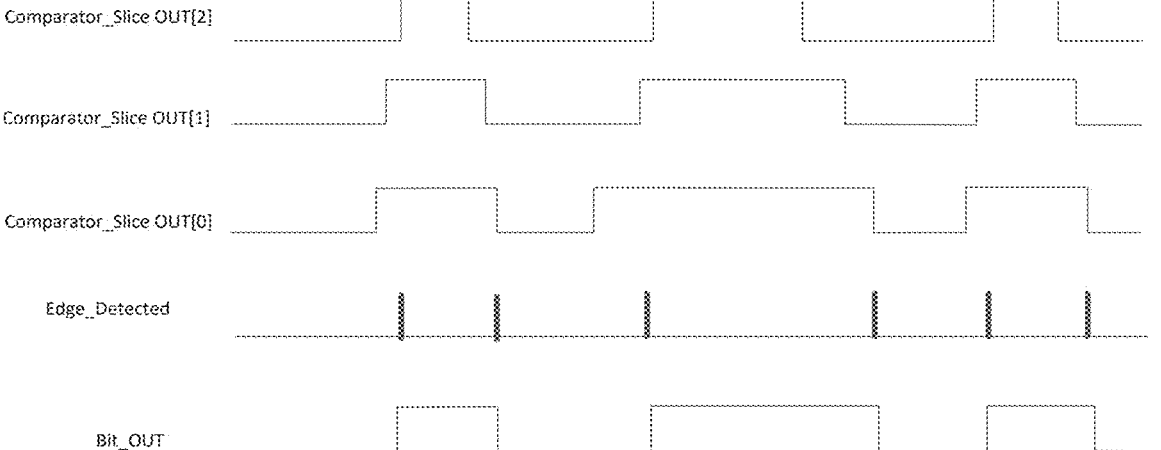
FIG. 6 is a schematic operation waveform diagram of a noise filtering and signal edge detection circuit 105 according to a preferred embodiment of the present disclosure.

FIG. 6 is a schematic operation waveform diagram of a noise filtering and signal edge detection circuit 105 according to a preferred embodiment of the present disclosure. Please refer to FIG. 6. The waveform 'Edge_detected' is the edge detection pulse output by the noise filtering and signal edge detection circuit 105. The waveform 'Bit_OUT' is the edge detection signal with noise removed, decoded by the digital signal information processing circuit 106 based on the edge detection pulse output by the noise filtering and signal edge detection circuit 105.

Figure 7:
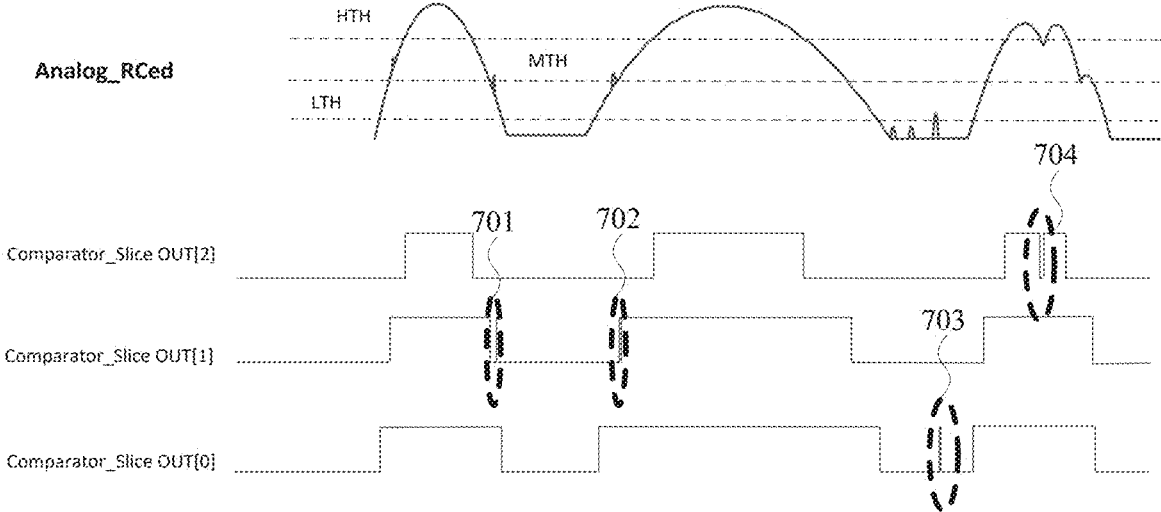
FIG. 7 is a schematic operation waveform diagram of a first comparator 201, a second comparator 202, and a third comparator 203 encountering noise according to a preferred embodiment of the present disclosure.

FIG. 7 is a schematic operation waveform diagram of a first comparator 201, a second comparator 202, and a third comparator 203 encountering noise according to a preferred embodiment of the present disclosure. Please refer to FIG. 7. It can be observed from this embodiment that when the analog signal to be decoded, Analog_RCed, encounters noise passing through the reference voltage levels HTH, MTH, and LTH, the comparators 201, 202, 203 are triggered and changed, causing them to output inappropriate noise pulses 701, 702, 703, 704, respectively.

Figure 8:
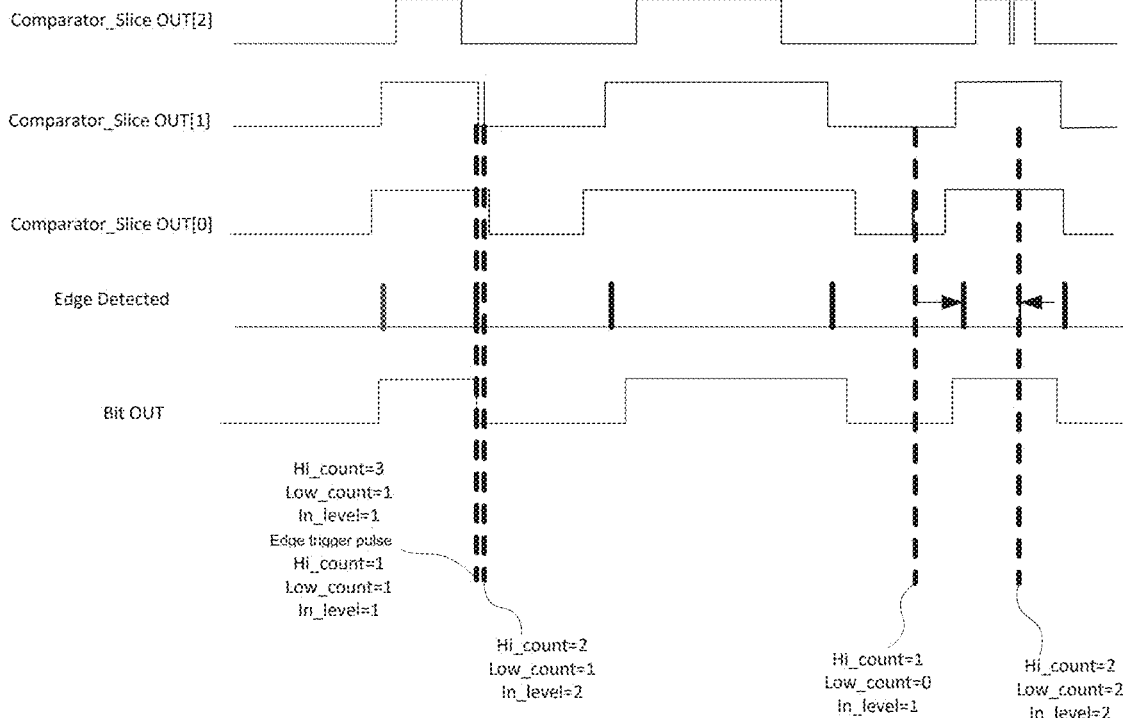
FIG. 8 is a schematic operation waveform diagram of a noise filtering and signal edge detection circuit 105 according to a preferred embodiment of the present disclosure.

FIG. 8 is a schematic operation waveform diagram of a noise filtering and signal edge detection circuit 105 according to a preferred embodiment of the present disclosure. Please refer to FIG. 8. It can be observed from this embodiment that before the time of label 701, step S407 is triggered, and thus the highest level variable Hi_count and the lowest level variable Low_count are both set to 1. At the time of label 702, Hi_count changes to 2 and Low_count remains at 1, and thus the noise filtering and signal edge detection circuit 105 is not triggered to output the edge detection pulse. Similarly, at the time of label 703, Hi_count is 1 and Low_count remains at 0, and thus the noise filtering and signal edge detection circuit 105 is not triggered to output the edge detection pulse. At the time of label 704, Hi_count is 2 and Low_count remains at 2, and thus the noise filtering and signal edge detection circuit 105 is not triggered to output the edge detection pulse.

To allow those skilled in the art understand the present disclosure, three comparators 201, 202, 203 and three values are used as examples, and the noise tolerance value is simply set to 1 in the aforementioned embodiments. However, those skilled in the art, after referring to the aforementioned embodiments, should understand that the more comparators and numbers are designed, the larger the noise tolerance value should be designed to obtain more accurate noise filtering results. Additionally, although the aforementioned embodiments are illustrated using the USB PD protocol, and thus Bi-Phase Marker Coded (BMC) decoding are used as examples. Those skilled in the art should know that other encoding methods in other application fields, such as Manchester encoding, may also adopt the technology of the present disclosure for decoding and noise filtering, and thus the present disclosure is not limited herein.

The aforementioned embodiments are related to an edge detection technology for noise elimination of surge pulses. However, in practice, there are three types of DC noise as described in the prior art, namely the DC voltage amplitude of external signals. This noise often causes the input signal voltage to deviate from the allowable logic voltage levels, leading to decoding errors. In the following embodiments, the edge detection method described above is similarly adopted. The difference is that the noise filtering and signal edge detection circuit 105 will be optimized based on the DC noise processed as described above.

Figure 9:
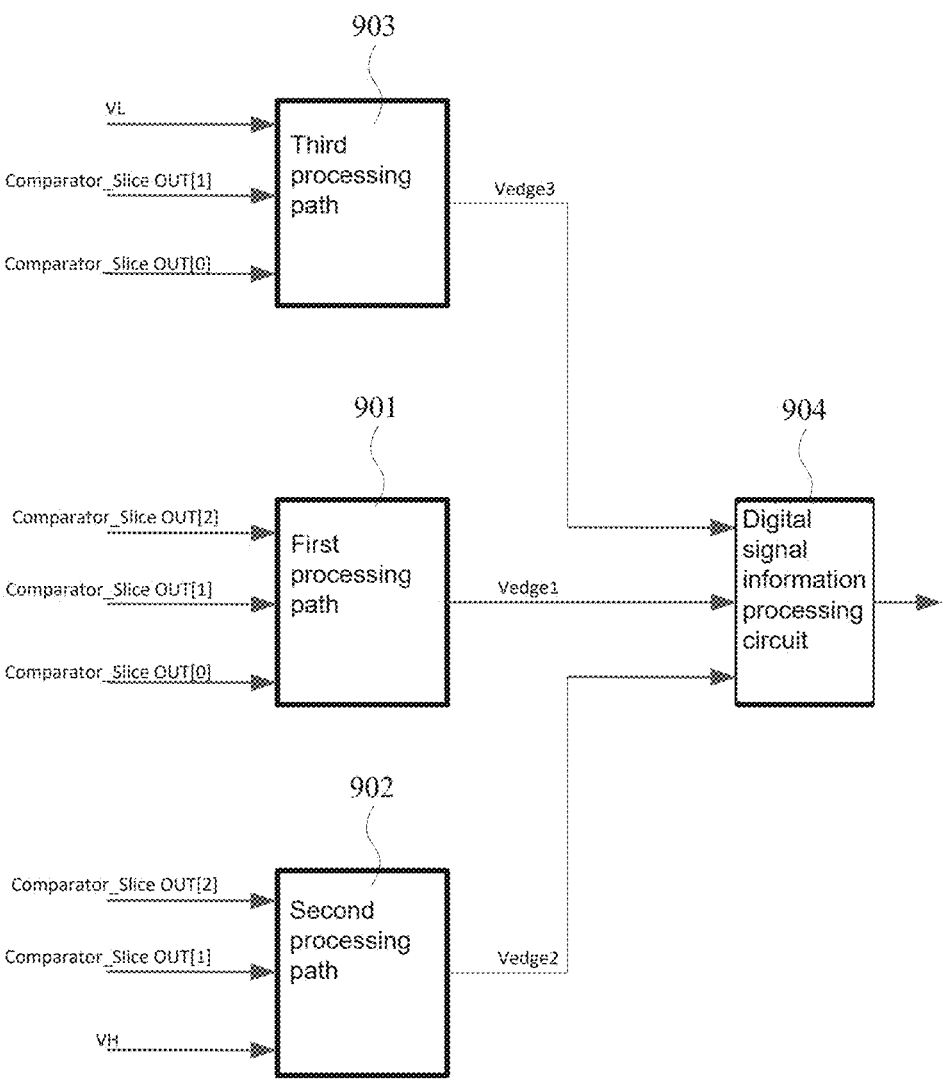
FIG. 9 is a schematic circuit block diagram of a noise filtering and signal edge detection circuit 105 according to a preferred embodiment of the present disclosure.

FIG. 9 is a schematic circuit block diagram of a noise filtering and signal edge detection circuit 105 according to a preferred embodiment of the present disclosure. Please refer to FIG. 9. The noise filtering and signal edge detection circuit 105 includes a first processing path 901, a second processing path 902, and a third processing path 903. To allow those skilled in the art understand this technology, a digital signal information processing circuit 904 for decoding the edge detection signals Vedge1, Vedge2, and Vedge3 output from the first processing path 901, second processing path 902, and third processing path 903, respectively, is also illustrated in this diagram. In order for the decoded signals decoded from the first processing path 901, second processing path 902, and third processing path 903 to be predictable, the analog signal to be decoded Analog_RCed comes from delivery of a known signal in this embodiment. In this embodiment, the preferred choice is the preamble signal. Since the preamble signal is 64 bits of alternating "0" and "1" bits (e.g., "010101 . . . "), the ideal decoded signals decoded from the edge detection signals Vedge1, Vedge2, and Vedge3 are also predictable.

In this embodiment, the first processing path 901, second processing path 902, and third processing path 903 all adopt the noise filtering and signal edge detection technology explained in FIG. 1 to FIG. 8. Since this embodiment does not focus on noise filtering, those skilled in the art may also use other edge detection technologies. In this embodiment, the first processing path 901 receives signals Comparator_Slice OUT[0], Comparator_Slice OUT[1], and Comparator_Slice OUT[2] from the output terminals of three comparators 201, 202, 203 to generate the first edge detection signal Vedge1. The second processing path 902 receives comparator signals Comparator_Slice OUT[1], Comparator_Slice OUT[2] from the output terminals of comparators 202, 203, and a low-level voltage VH set to logic 1 for a long time to generate the second edge detection signal Vedge2. The third processing path 903 receives comparator signals Comparator_Slice OUT[0], Comparator_Slice OUT[1] from the output terminals of comparators 201, 202, and a high-level voltage V0 set to logic 0 for a long time to generate the third edge detection signal Vedge3.

It can be observed from the above embodiments that the second processing path 902 is equivalent to setting a lower limit for the current level number in_level, which is herein referred to as the low-level number. For example, the logic low voltage is forced to rise to 250 mV under the noise certification condition TX_GROUP_3. In this case, the second bit restored signal decoded by the second edge detection signal Vedge2 generated by the second processing path 902 is more in line with the ideal bit restored signal. Similarly, the third processing path 903 is equivalent to setting an upper limit for the current level number in_level, which is herein referred to as the high-level number. For example, the logic high voltage is forced to drop to 790 mV under the noise certification condition TX_GROUP_2. In this case, the third bit restored signal decoded by the third edge detection signal Vedge3 generated by the third processing path 903 is more in line with the ideal bit restored signal. Similarly, the first processing path 901 is equivalent to performing edge detection in a normal way. For example, the logic high voltage is forced to rise to 1200 mV and the logic low voltage remains unchanged under the noise certification condition TX_GROUP_1. In this case, the first bit restored signal decoded by the first edge detection signal Vedge1 generated by the first processing path 901 is more in line with the ideal bit restored signal.

The digital signal information processing circuit 904 receives the first edge detection signal Vedge1, the second edge detection signal Vedge2, and the third edge detection signal Vedge3 mentioned above, performs the decoding process on the first edge detection signal Vedge1, the second edge detection signal Vedge2, and the third edge detection signal Vedge3 mentioned above to obtain the first bit restored signal, the second bit restored signal, the third bit restored signal, and compares the bit time length of the first bit restored signal, the second bit restored signal, and the third bit restored signal with the standard time length of the bit time length specified in the decoding specification to obtain a bit restored signal with the smallest difference. For example, if the bit rate is 270K at this time, with a clock of 12 MHz, one bit is approximately 44.4 times the length of the clock. Thus, as long as the decoded bit restored signal with the smallest difference from the above 44.4 clock length is found, the corresponding edge detection signal Vedge1, Vedge2, or Vedge3 can be found. In this way, subsequent data can use the optimum edge detection signal Vedge1, Vedge2, or Vedge3 selected in the above manner as the edge detection signal for subsequent decoding.

Figure 10:
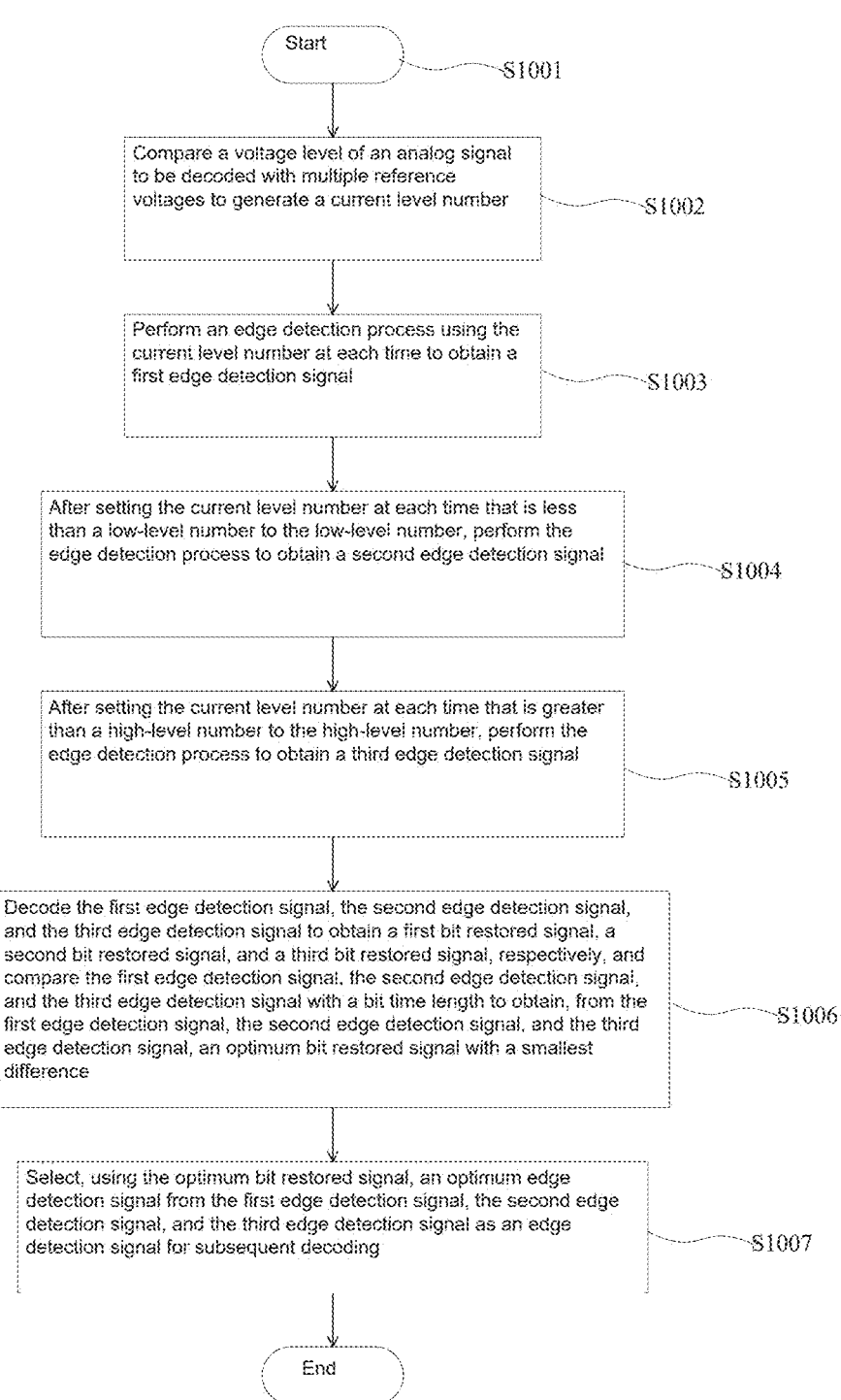
FIG. 10 is a schematic flowchart diagram of a method for reducing the influence of power signal line noise on decoding according to a preferred embodiment of the present disclosure.

FIG. 10 is a schematic flowchart diagram of a method for reducing the influence of power signal line noise on decoding according to a preferred embodiment of the present disclosure. Please refer to FIG. 10. This method for reducing the influence of power signal line noise on decoding includes the following steps:

Step S1001: Start.

Step S1002: Compare a voltage level of an analog signal to be decoded with multiple reference voltages to generate a current level number. In this embodiment, the analog signal to be decoded is, for example, a preamble signal. Since the preamble signal is a known signal, the decoded bits are also predictable. Thus, the preferred embodiment uses the preamble signal as an example, but those skilled in the art may use other known signals as embodiments, and the details are omitted herein.

Step S1003: Perform an edge detection process using the current level number at each time to obtain a first edge detection signal, such as the first processing path 901 above.

Step S1004: After setting the current level number at each time that is less than a low-level number to the low-level number, perform the edge detection process to obtain a second edge detection signal, such as the second processing path 902 above.

Step S1005: After setting the current level number at each time that is greater than a high-level number to the high-level number, perform the edge detection process to obtain a third edge detection signal, such as the third processing path 903 above.

Step S1006: Decode the first edge detection signal, the second edge detection signal, and the third edge detection signal to obtain a first bit restored signal, a second bit restored signal, and a third bit restored signal, respectively, and compare the first edge detection signal, the second edge detection signal, and the third edge detection signal with a bit time length to obtain, from the first edge detection signal, the second edge detection signal, and the third edge detection signal, an optimum bit restored signal with a smallest difference.

Step S1007: Select, using the optimum bit restored signal, an optimum edge detection signal from the first edge detection signal, the second edge detection signal, and the third edge detection signal as an edge detection signal for subsequent decoding.

Figure 11:
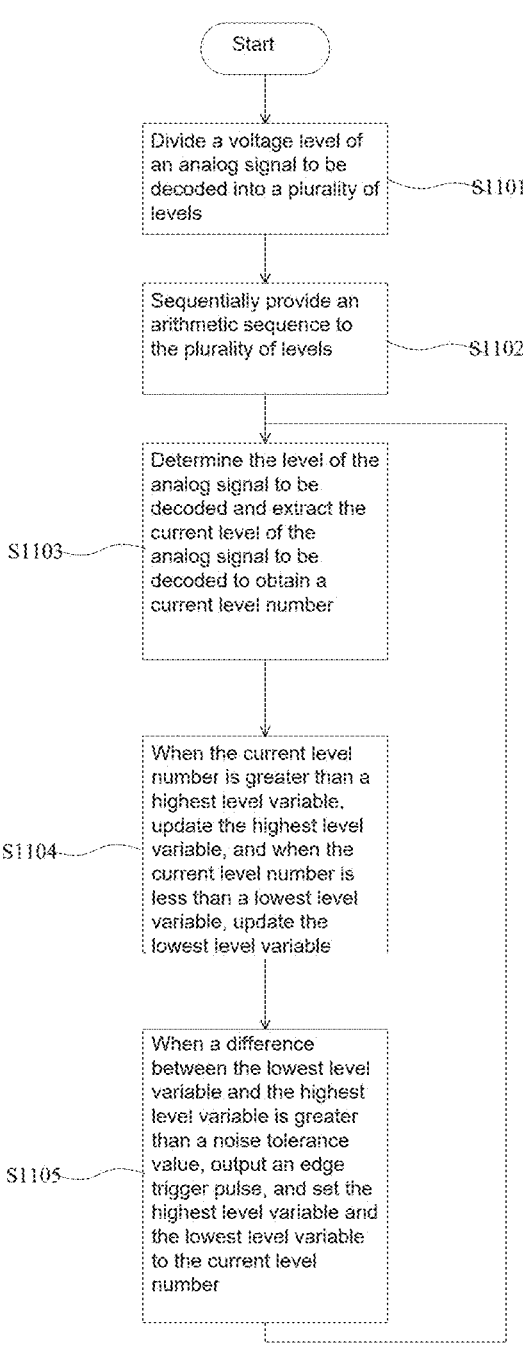
FIG. 11 is a schematic flowchart diagram of an edge detection process of a method for reducing the influence of power signal line noise on decoding according to a preferred embodiment of the present disclosure.

FIG. 11 is a schematic flowchart diagram of an edge detection process of a method for reducing the influence of power signal line noise on decoding according to a preferred embodiment of the present disclosure. Please refer to FIG. 11. This edge detection process includes the following steps:

Step S1101: Divide a voltage level of an analog signal to be decoded into a plurality of levels. As described in the embodiment of FIG. 2, use multiple comparators to detect the voltage levels of the analog signal to be decoded.

Step S1102: Sequentially provide an arithmetic sequence to the plurality of levels. As described in the preferred embodiment above, three bits 1, 2, and 3 are respectively used as examples. Those skilled in the art may also use numbers such as 2, 4, and 6. The present disclosure is not limited herein. The numbers may be changed according to the difference between the levels.

Step S1103: Determine the level of the analog signal to be decoded and extract the current level of the analog signal to be decoded to obtain a current level number, as described in the method of FIG. 3.

Step S1104: When the current level number is greater than a highest level variable, update the highest level variable, and when the current level number is less than a lowest level variable, update the lowest level variable, as described in steps S403 to S406 of the aforementioned embodiment.

Step S1105: When a difference between the lowest level variable and the highest level variable is greater than a noise tolerance value, output an edge detection pulse, set the highest level variable and the lowest level variable to the current level number, and continuously determine a level of the analog signal to be decoded to obtain the current level number.

In summary, the embodiments of the present disclosure use known signals, respectively sample the received signal to be decoded through multiple comparators and multiple reference voltages, and convert it into a current level number to generate a first edge detection signal. In the meanwhile, the embodiments of the present disclosure set the current level number to a low-level number as the lower limit to generate a second edge detection signal, and set the current level number to a high-level number as the upper limit to generate a third edge detection signal. The embodiments of the present disclosure decode these three sets of edge detection signals and compare them with the known signals to obtain the optimum edge detection signal. Accordingly, the optimum edge detection signal may be used for subsequent decoding. Thus, the present disclosure can solve any bit misjudgment caused by DC noise.

Additionally, in the preferred embodiments, the edge detection process uses setting multiple levels, defines the values corresponding to these levels, the current level number, the highest level variable, and the lowest level variable, and detects the times when the analog signal to be decoded reaches multiple levels respectively. Based on the level reached by the analog signal to be decoded, the edge detection process changes the current level number, the highest level variable, and the lowest level variable. When the difference between the highest level variable and the lowest level variable is greater than the noise tolerance value, the edge detection pulse is triggered and the highest level variable and the lowest level variable are set to the current level number. Accordingly, even if the difference between the highest level variable and the lowest level variable changes due to noise, as long as it is less than the noise tolerance value, it will not cause any influence on the circuit operation.

It should be understood that the examples and the embodiments described herein are for illustrative purpose only, and various modifications or changes in view of them will be suggested to those skilled in the art, and will be comprised in the spirit and scope of the application and the appendix with the scope of the claims.

What is claimed is:

1. A decoding method for reducing influence of noise of power signal line, comprising:

comparing a voltage level of an analog signal to be decoded with multiple reference voltages to generate a current level number;

performing an edge detection process using the current level number at each time to obtain a first edge detection signal;

after setting the current level number at each time that is less than a low-level number to the low-level number, performing the edge detection process to obtain a second edge detection signal;

after setting the current level number at each time that is greater than a high-level number to the high-level number, performing the edge detection process to obtain a third edge detection signal;

decoding the first edge detection signal, the second edge detection signal, and the third edge detection signal to obtain a first bit restored signal, a second bit restored signal, and a third bit restored signal, respectively, and comparing the first edge detection signal, the second edge detection signal, and the third edge detection signal with a bit time length to obtain an optimum bit restored signal, which has a smallest difference, among the first edge detection signal, the second edge detection signal, and the third edge detection signal;

using the optimum bit restored signal to select an optimum edge detection signal from the first edge detection signal, the second edge detection signal, and the third edge detection signal as a specific edge detection signal for subsequent decoding, wherein the analog signal to be decoded is obtained from delivery of a known signal.

2. The decoding method for reducing influence of noise of power signal line according to the claim 1, wherein the edge detection process comprises:

when the current level number is greater than a highest level variable, updating the highest level variable to the current level number;

when the current level number is less than a lowest level variable, updating the lowest level variable to the current level number;

when a difference between the lowest level variable and the highest level variable is greater than a noise tolerance value, outputting an edge detection pulse, setting the highest level variable and the lowest level variable to the current level number, and continuously determining a level of the analog signal to be decoded to obtain the current level number; and generating the specific edge detection signal based on the edge detection pulse.

3. The decoding method for reducing influence of noise of power signal line according to the claim 1, wherein the analog signal to be decoded is obtained via a channel configuration pin (CC pin) of a universal serial bus (USB) port.

4. The decoding method for reducing influence of noise of power signal line according to the claim 1, wherein the analog signal to be decoded is modulated according to a Bi-Phase Marker Code (BMC).

5. The decoding method for reducing influence of noise of power signal line according to the claim 1, wherein the known signal is a preamble signal.

6. A decoding circuit, comprising:

a plurality of comparators, wherein each of the plurality of comparators comprises a first terminal, a second terminal, and an output terminal, wherein the first terminals of the plurality of comparators receive an analog signal to be decoded, wherein the second terminals of the plurality of comparators are respectively coupled to a plurality of reference voltage levels, wherein the plurality of reference voltage levels are different from each other; and a noise filtering and signal edge detection circuit coupled to the output terminals of the plurality of comparators;

wherein the noise filtering and signal edge detection circuit determines a current level of the analog signal to be decoded based on signals output from the output terminals of the comparators, to obtain a current level number;

wherein the noise filtering and signal edge detection circuit performs an edge detection process based on the current level number at each time to obtain a first edge detection signal;

wherein after setting the current level number at each time that is less than a low-level number to the low-level number, the noise filtering and signal edge detection circuit performs the edge detection process to obtain a second edge detection signal;

wherein after setting the current level number at each time that is greater than a high-level number to the high-level number, the noise filtering and signal edge detection circuit performs the edge detection process to obtain a third edge detection signal;

wherein the decoding circuit further comprises:

a digital signal information processing circuit, coupled to the output terminals of the noise filtering and signal edge detection circuit, and configured to decode the first edge detection signal, the second edge detection signal, and the third edge detection signal to obtain a first bit restored signal, a second bit restored signal, and a third bit restored signal, respectively, and configured to compare the first edge detection signal, the second edge detection signal, and the third edge detection signal with a bit time length to obtain an optimum bit restored signal with a smallest difference;

wherein the digital signal information processing circuit selects, based on the optimum bit restored signal, an optimum edge detection signal from the first edge detection signal, the second edge detection signal, and the third edge detection signal as a specific edge detection signal for subsequent decoding, wherein the analog signal to be decoded is obtained from delivery of a known signal.

7. The decoding circuit according to the claim 6, wherein the analog signal to be decoded is obtained via a channel configuration pin (CC pin) of a universal serial bus port.

8. The decoding circuit according to the claim 6, wherein the analog signal to be decoded is modulated based on a Bi-Phase Marker Code (BMC), and the digital signal information processing circuit is a BMC decoding circuit.

9. The decoding circuit according to the claim 6, wherein the noise filtering and signal edge detection circuit determines a current level of the analog signal to be decoded based on signals output by the output terminals of the comparators, to obtain the current level number, wherein the noise filtering and signal edge detection circuit has a highest level variable and a lowest level variable, wherein when the current level number is greater than the highest level variable, the highest level variable is updated to the current level number;

wherein when the current level number is less than the lowest level variable, the lowest level variable is updated to the current level number, wherein when a difference between the lowest level variable and the highest level variable is greater than a noise tolerance value, the noise filtering and signal edge detection circuit outputs an edge detection pulse, sets the highest level variable and the lowest level variable to the current level number, and continuously determines a level of the analog signal to be decoded to obtain the current level number.

10. The decoding circuit according to the claim 6, wherein the known signal is a preamble signal.

* * * * *